US011011552B2

(12) United States Patent
Park et al.

(10) Patent No.: US 11,011,552 B2
(45) Date of Patent: May 18, 2021

(54) METHOD FOR MANUFACTURING A DISPLAY SUBSTRATE COMPRISING INTERCONNECTED FIRST AND SECOND WIRINGS

(71) Applicant: SAMSUNG DISPLAY CO., LTD., Yongin-si (KR)

(72) Inventors: Ji-Yong Park, Yongin-si (KR); Tae-Gon Kim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/141,039

(22) Filed: Sep. 25, 2018

(65) Prior Publication Data

US 2019/0027502 A1 Jan. 24, 2019

Related U.S. Application Data

(62) Division of application No. 14/511,070, filed on Oct. 9, 2014, now Pat. No. 10,096,624.

(30) Foreign Application Priority Data

Oct. 14, 2013 (KR) ........................ 10-2013-0121826

(51) Int. Cl.
*H01L 27/12* (2006.01)
*H01L 27/32* (2006.01)
(Continued)

(52) U.S. Cl.
CPC ........ *H01L 27/124* (2013.01); *H01L 27/1255* (2013.01); *H01L 27/3276* (2013.01);
(Continued)

(58) Field of Classification Search
CPC ............. H01L 21/76877; H01L 27/124; H01L 27/1255; H01L 27/3276; H01L 29/66757
See application file for complete search history.

(56) References Cited

U.S. PATENT DOCUMENTS 5,173,442 A 12/1992 Carey
8,704,237 B2 4/2014 Lee et al.
(Continued)

FOREIGN PATENT DOCUMENTS

KR 10-2007-0119918 A 12/2007
KR 10-2009-0080738 A 7/2009
(Continued)

OTHER PUBLICATIONS

Korean Office Action dated Nov. 26, 2019 issued in corresponding Korean Patent Appln No. 10-2013-121826.

*Primary Examiner* — Eduardo A Rodela
*Assistant Examiner* — Christopher M Roland
(74) *Attorney, Agent, or Firm* — F. Chau & Associates, LLC

(57) ABSTRACT

Display substrates and display devices with reduced electrical resistance are disclosed. One inventive aspect includes a switching device, a first wiring and a second wiring. The switching device includes a first semiconductor layer, first and second gate insulation layers, a source electrode and a drain electrode. The source and drain electrodes are formed to electrically connect, through the first and second gate insulation layers, to the first semiconductor layer. The second wiring is formed on the second gate insulation layer and electrically connected to the first wiring.

6 Claims, 10 Drawing Sheets

(51) Int. Cl.
    *H01L 29/786*     (2006.01)
    *H01L 21/768*     (2006.01)
    *H01L 29/66*     (2006.01)

(52) U.S. Cl.
    CPC .... *H01L 21/76877* (2013.01); *H01L 27/1259* (2013.01); *H01L 27/3279* (2013.01); *H01L 29/66757* (2013.01); *H01L 29/7869* (2013.01); *H01L 29/78666* (2013.01); *H01L 29/78675* (2013.01)

(56) References Cited

U.S. PATENT DOCUMENTS

| | | | |
|---|---|---|---|
| 2005/0079657 A1* | 4/2005 | Yoo | G02F 1/13458 438/151 |
| 2005/0110023 A1* | 5/2005 | Lee | H01L 27/124 257/72 |
| 2005/0161680 A1 | 7/2005 | Kawakami et al. | |
| 2006/0091399 A1* | 5/2006 | Lee | H01L 27/12 257/72 |
| 2006/0292865 A1 | 12/2006 | Yamazaki et al. | |
| 2007/0290967 A1* | 12/2007 | Jang | G09G 3/3677 345/87 |
| 2007/0295962 A1* | 12/2007 | Choi | H01L 27/1214 257/59 |
| 2009/0033818 A1 | 2/2009 | Nakajima et al. | |
| 2009/0184326 A1 | 7/2009 | Lee et al. | |
| 2011/0108848 A1 | 5/2011 | Lee et al. | |
| 2012/0098008 A1 | 4/2012 | Song et al. | |
| 2012/0139000 A1* | 6/2012 | Lee | H01L 27/3276 257/99 |
| 2012/0146060 A1 | 6/2012 | Moon et al. | |
| 2012/0326156 A1 | 12/2012 | Choi et al. | |
| 2013/0037818 A1* | 2/2013 | Lee | H01L 27/3258 257/72 |
| 2013/0044044 A1 | 2/2013 | Ha et al. | |
| 2013/0069238 A1 | 3/2013 | Usami et al. | |
| 2013/0207117 A1 | 8/2013 | An et al. | |
| 2014/0034923 A1 | 2/2014 | Kim et al. | |
| 2014/0097455 A1 | 4/2014 | Ono | |
| 2015/0102343 A1 | 4/2015 | Park et al. | |
| 2016/0190224 A1* | 6/2016 | Kim | H01L 27/124 257/40 |
| 2016/0300902 A1 | 10/2016 | You et al. | |
| 2017/0005154 A1 | 1/2017 | You et al. | |

FOREIGN PATENT DOCUMENTS

| | | |
|---|---|---|
| KR | 10-2013-0006948 | 1/2013 |
| KR | 10-2013-0017342 | 2/2013 |
| KR | 10-2013-0020068 A | 2/2013 |
| KR | 10-2013-0024029 A | 3/2013 |

* cited by examiner

METHOD FOR MANUFACTURING A DISPLAY SUBSTRATE COMPRISING INTERCONNECTED FIRST AND SECOND WIRINGS

CROSS-REFERENCE TO RELATED APPLICATIONS

This application is a Divisional of U.S. application Ser. No. 14/511,070, filed on Oct. 9, 2014, which claims priority under 35 U.S.C. § 119 to Korean Patent Application No. 10-2013-0121826, filed on Oct. 14, 2013, in the Korean Intellectual Property Office, the disclosures of which are incorporated by reference herein in their entireties.

BACKGROUND

Field

The disclosed technology relates to display substrates having electronic devices and wiring structures and related manufacturing methods.

Description of the Related Technology

As for a flat panel display, for example, an organic light emitting diode (OLED) device or a liquid crystal display (LCD) display panel, a light emitting structure including an organic light emitting layer or a liquid crystal layer is formed on a display substrate.

The display substrate includes many switching devices known as thin film transistors (TFTs), capacitors and wiring structures such as data and gate lines. A current and an electrical signal are applied through the wiring structure. However, as the resistance of the wiring structure increases, imaging characteristics of the display degraded due to, for example, signal delays. More particularly, as the resolution of the display increases, the width and/or thickness of the wiring structure decrease to result in a higher overall resistance of the wiring structure.

SUMMARY OF CERTAIN INVENTIVE ASPECTS

Various exemplary embodiments include a display substrate having excellent electrical and operational characteristics.

Various exemplary embodiments include a method of manufacturing a display substrate having excellent electrical and operational characteristics.

Various exemplary embodiments include a display device including a display substrate having excellent electrical and operational characteristics.

According to one aspect of the disclosed technology, there is included a display substrate that includes a switching device, a first wiring and a second wiring. The switching device includes a first semiconductor layer, a first gate insulation layer, a gate electrode and a second gate insulation layer sequentially formed on a base substrate. The switching device further includes a source electrode and a drain electrode which are formed through the second and first gate insulation layers to be electrically connected to the first semiconductor layer. The first wiring is formed on the first gate insulation layer. The second wiring is formed on the second gate insulation layer. The second wiring is superimposed over the first wiring and electrically connected to the first wiring.

In some exemplary embodiments, the display substrate may include a lower electrode on the first gate insulation layer and an upper electrode on the second gate insulation layer. A capacitor may be defined by the lower electrode, the second gate insulation layer and the upper electrode.

In some other exemplary embodiments, the display device may include a second semiconductor layer located on the same layer as the first semiconductor layer. The second semiconductor layer may overlap with the lower electrode.

In some other exemplary embodiments, the first wiring may serve as a gate line.

In some other exemplary embodiments, the second gate insulation layer may include a contact hole at least partially exposing the first wiring, and the second wiring may make contact with the first wiring through the contact hole.

In some other exemplary embodiments, the display substrate may include a via structure electrically connecting the first wiring and the second wiring to each other.

In some other exemplary embodiments, the via structure may be in contact with portions of a top surface and a lateral surface of the second wiring, and the via structure may be landed on a top surface of the first wiring.

In some other exemplary embodiments, the via structure may be in contact with portions of a top surface and a lateral surface of the second wiring, and the via structure may be in contact with portions of the first wiring and the first gate insulation layer.

In some other exemplary embodiments, a width or a diameter of the via structure may be decreased discontinuously from a contact portion with the second wiring.

In some other exemplary embodiments, the second wiring may have a width smaller than that of the first wiring or the first wiring and the second wiring may have a staggered arrangement.

According to another aspect of the disclosed technology, there is a manufacturing method, in which a first semiconductor layer is formed on a base substrate. A first gate insulation layer covering the first semiconductor layer is formed on the base substrate. A gate electrode and a first wiring is formed on the first gate insulation layer. A second gate insulation layer covering the gate electrode and the first wiring is formed on the first gate insulation layer. A second wiring is formed on the second gate insulation layer. The second wiring is superimposed over the first wiring and electrically connected to the first wiring. A source electrode and a drain electrode are formed through the second and first gate insulation layers to be electrically connected to the first semiconductor layer.

In some exemplary embodiments, the gate electrode and the first wiring may be formed by the same etching process.

In some other exemplary embodiments, a lower electrode may be formed on the first gate insulation layer. An upper electrode may be formed on the second gate insulation layer. The upper electrode may be superimposed over the lower electrode. The lower electrode, the gate electrode and the first wiring may be formed by the same etching process, and the upper electrode and the second wiring may be formed by the same etching process.

In some other exemplary embodiments, in the step of forming the second wiring, the second gate insulation layer may be partially removed to form a contact hole at least partially exposing the first wiring. The conductive layer may be formed on the second gate insulation layer to fill the contact hole. The conductive layer may be patterned to form the second wiring.

In some other exemplary embodiments, a via structure that electrically connects the first and second wirings to each other may be formed.

In some other exemplary embodiments, the via structure may be formed simultaneously with the source electrode and the drain electrode.

In some other exemplary embodiments, an insulating interlayer covering the second wiring may be formed on the second gate insulation layer. The insulating interlayer, the second gate insulation layer and the first gate insulation layer may be partially removed to form first openings that expose the first semiconductor layer. The insulating interlayer and the second gate insulation layer may be partially removed to form a second opening that partially exposes the second wiring and the first wiring. A conductive layer may be formed on the insulating interlayer to fill the first and second openings. The conductive layer may be patterned to form the source electrode, the drain electrode and the via structure.

In some other exemplary embodiments, the first openings and the second opening may be formed by the same etching process.

According to another aspect of the disclosed technology, there is a display device that includes a switching device, a first wiring, a second wiring, a first electrode, an organic light emitting layer and a second electrode. The switching device includes a first semiconductor layer, a first gate insulation layer, a gate electrode and a second gate insulation layer sequentially formed on a base substrate. The switching device further includes a source electrode and a drain electrode which are formed through the second and first gate insulation layers to be electrically connected to the first semiconductor layer. The first wiring is formed on the first gate insulation layer. The second wiring is formed on the second gate insulation layer. The second wiring is superimposed over the first wiring and electrically connected to the first wiring. The first electrode is electrically connected to the drain electrode. The organic light emitting layer is formed on the first electrode. The second electrode is formed on the organic light emitting layer.

In exemplary embodiments, the display device may include a lower electrode on the first gate insulation layer and an upper electrode on the second gate insulation layer. A capacitor may be defined by the lower electrode, the second gate insulation layer and the upper electrode.

According to various exemplary embodiments, a first wiring and a second wiring of a display substrate are configured to make a parallel connection and included as a signal wiring, e.g., a gate line. As such, an electrical resistance of the signal wiring is reduced without increasing a width or a thickness of each wiring. Additionally, the first and second wirings may be formed by the same patterning process for other electrode structures. Therefore, such a wiring structure with reduced electrical resistance can be obtained without performing additional processes.

BRIEF DESCRIPTION OF THE DRAWINGS

Exemplary embodiments will be more clearly understood from the following detailed description taken in conjunction with the accompanying drawings. FIGS. 1 to 16 represent non-limiting, exemplary embodiments as described herein:

FIG. 1 is a cross-sectional view illustrating a display substrate in accordance with some exemplary embodiments.

FIG. 2 is a cross-sectional view of a buffer layer, a first semiconductor layer and a second semiconductor layer formed on a substrate as part of a method of manufacturing the display substrate of FIG. 1 according to an embodiment.

FIG. 3 is a cross-sectional view illustrating a gate insulation layer, a gate electrode and a first wiring formed as part of a method of manufacturing the display substrate of FIG. 1 according to an embodiment.

FIG. 4 is a cross-sectional view illustrating first, second, third and fourth impurity regions formed as part of a method of manufacturing the display substrate of FIG. 1 according to an embodiment.

FIG. 5 is a cross-sectional view illustrating an upper electrode and a second wiring formed as part of a method of manufacturing the display substrate of FIG. 1 according to an embodiment.

FIG. 6 is a cross-sectional view illustrating an insulating interlayer, a source electrode and a drain electrode formed as part of a method of manufacturing the display substrate of FIG. 1 according to an embodiment.

FIG. 8 is a cross-sectional view illustrating a buffer layer, first and second semiconductor layers, first and second gate insulation layers, a gate electrode, a lower electrode and a first wiring formed on a substrate as part of a method of manufacturing the display substrates of FIGS. 7A and 7B according to an embodiment.

FIG. 9 is a cross-sectional view illustrating an upper electrode and a second wiring formed as part of a method of manufacturing the display substrates of FIGS. 7A and 7B according to an embodiment.

FIG. 12 is a cross-sectional view illustrating an OLED display device including a display substrate in accordance with some exemplary embodiments.

FIG. 13 is a cross-sectional view illustrating a display substrate formed according to the embodiments of FIG. 2-6 or 8-11B formed as part of a method of manufacturing the display device of FIG. 12 according to an embodiment.

FIG. 14 is a cross-sectional view illustrating a planarization layer, a first electrode, a second contact hole and a conductive layer formed as part of a method of manufacturing the display device of FIG. 12 according to an embodiment.

FIG. 15 is a cross-sectional view illustrating a pixel defining layer formed as part of a method of manufacturing the display device of FIG. 12 according to an embodiment.

FIG. 16 is a cross-sectional view illustrating an organic light emitting layer and a second electrode formed as part of a method of manufacturing the display device of FIG. 12 according to an embodiment.

DETAILED DESCRIPTION OF CERTAIN INVENTIVE EMBODIMENTS

Figure 1:
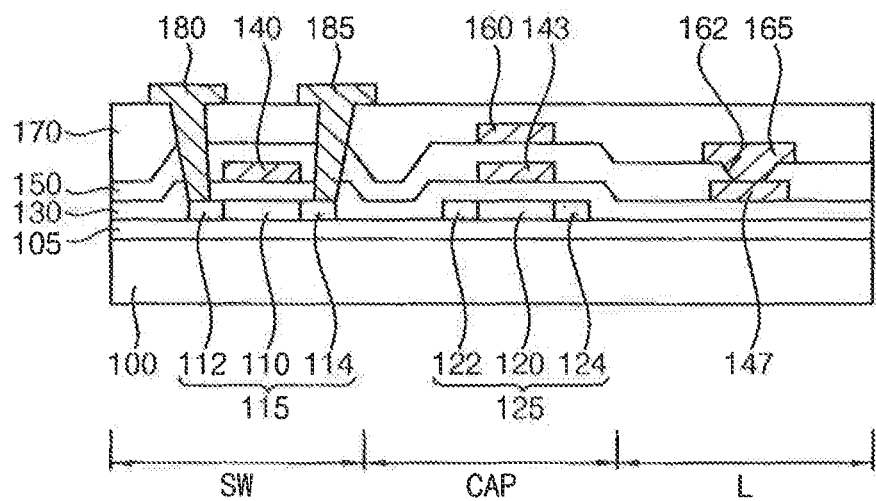

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are included so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

In the following description, technical terms are used only to explain a specific exemplary embodiment while not limiting the disclosed technology. The terms of a singular form may include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

It will be understood that when a layer, region, or component is referred to as being "formed on," another layer, region, or component, it can be directly or indirectly formed on the other layer, region, or component. That is, for example, intervening layers, regions, or components may be present.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements may also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but may also be indirectly connected to the second element via a third element. Further, some of the elements that are not essential to the complete understanding of the disclosed technology are omitted for clarity. Also, like reference numerals refer to like elements throughout.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a display substrate in accordance with exemplary embodiments.

Referring to FIG. 1, the display substrate includes a switching device, a capacitor and a wiring structure formed on a base substrate 100.

The base substrate 100 includes a switching device region SW, a capacitor region CAP and a wiring region L. The switching device, the capacitor and the wiring structure may are formed on the switching device region SW, the capacitor region CAP and the wiring region L, respectively.

The base substrate 100 includes a transparent insulation substrate. In some exemplary implementations, the base substrate 100 includes a glass substrate, a transparent plastic substrate such as a polyethylene terephthalate (PET) substrate, a polyethylene naphthalate (PEN) substrate or a polyimide substrate, or a transparent metal oxide substrate.

A buffer layer 105 is formed on the base substrate 100. The buffer layer 105 inhibits impurities from being diffused into the base substrate 100. In addition, the buffer layer 105 may improve flatness throughout the base substrate 100. Further, a stress generated during a formation of a gate electrode 110 may be reduced or buffered by the buffer layer 105. The buffer layer 105 may be formed of, e.g., silicon oxide (SiOx), silicon nitride (SiNx) or silicon oxynitride (SiOxNy).

A first semiconductor layer 115 and a second semiconductor layer 125 are formed on the buffer layer 105. The first semiconductor layer 115 and the second semiconductor layer 125 may be located on the switching device region SW and the capacitor region CAP, respectively.

The first and second semiconductor layers 115 and 125 may be formed of amorphous silicon or polysilicon. The first semiconductor layer 115 may have a first impurity region 112 and a second impurity region 114 containing p-type or n-type dopants at both ends thereof. A portion of the first semiconductor layer 115 between the first impurity region 112 and the second impurity region 114 may be defined as a first channel portion 110. The second semiconductor layer 125 may have a third impurity region 122 and a fourth impurity region 124 at both ends thereof. A portion of the second semiconductor layer 125 between the third impurity region 122 and the fourth impurity region 124 may be defined as a second channel portion 120.

In one exemplary embodiment, the first and second semiconductor layers 115 and 125 include an oxide semiconductor. In this case, the first to fourth impurity regions 112, 114, 122 and 124 may be omitted. The oxide semiconductor may be formed of, e.g., indium gallium zinc oxide (IGZO), zinc tin oxide (ZTO) or indium tin zinc oxide (ITZO).

A first gate insulation layer 130 may be formed on the buffer layer 105 to cover the first and second semiconductor layers 115 and 125. The first gate insulation layer 130 may be formed of an insulation material such as silicon oxide, silicon nitride or silicon oxynitride. The first gate insulation layer 130 may have a single-layered structure or a multi-layered structure. In some exemplary implementations, the first gate insulation layer 130 has a multi-stacked structure including a silicon oxide layer or a silicon oxynitride layer.

The first gate insulation layer 130 may have stepped portions corresponding to the first and second semiconductor layers 115 and 125. Alternatively, the first gate insulation layer 130 may have a substantially even or leveled upper surface.

A gate electrode 140, a lower electrode 143 and a first wiring 147 may be formed on the first gate insulation layer 130.

The gate electrode 140 may be located on the switching device region SW and may be substantially superimposed over the first channel portion 110 of the first semiconductor layer 115. The lower electrode 143 may be located on the capacitor region CAP and may be substantially superimposed over the second channel portion 120 of the second semiconductor layer 125. The first wiring 147 may be located on the wiring region L.

The gate electrode 140, the lower electrode 143 and the first wiring 147 may be formed of a metal, an alloy or a metal nitride. In some exemplary implementations, the gate electrode 140, the lower electrode 143 and the first wiring 147 are formed of the metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) and scandium (Sc), the alloy thereof or the nitride thereof. Alternatively, the gate electrode 140, the lower electrode 143 and the first wiring 147 may be formed of a transparent conductive material such as indium tin oxide (ITO), indium zinc oxide (IZO), or aluminum doped zinc oxide (AZO). The gate electrode 140, the lower electrode 143 and the first wiring 147 may have a multi-layered structure including at least two materials selected from the metal, the alloy, the metal nitride and the transparent conductive material. In some exemplary embodiments, the gate electrode 140, the lower electrode 143 and the first wiring 147 include the same material.

In some exemplary embodiments, the first wiring 147 serves as a gate line of the display substrate. In this case, the first wiring 147 may be electrically connected to or integrally formed with the gate electrode 140.

A first thin film transistor (TFT) may be defined by the gate electrode 140, the first gate insulation layer 130 and the first semiconductor layer 115 in the switching device region SW. Additionally, a second TFT may be defined by the lower electrode 143, the first gate insulation layer 130 and the second semiconductor layer 125 in the capacitor region CAP. In this case, the lower electrode 143 may serve as a gate electrode of the second TFT.

A second gate insulation layer 150 may be formed on the first gate insulation layer 130 to cover the gate electrode 140, the lower electrode 143 and the first wiring 147. The second gate insulation layer 150 may be formed of an insulation material such as silicon oxide, silicon nitride or silicon oxynitride. In some exemplary implementations, the second gate insulation layer 150 has a multi-layered structure including a silicon oxide layer and a silicon oxynitride layer.

The second gate insulation layer 150 may have stepped portions corresponding to the gate electrode 140 and the lower electrode 143. Alternatively, the second gate insulation layer 1500 may have a substantially even or leveled upper surface.

An upper electrode 160 and a second wiring 165 may be formed on the second gate insulation layer 150. The upper electrode 160 may be located on the capacitor region CAP. The upper electrode 160 may be substantially superimposed over the lower electrode 143. The second wiring 165 may be located on the wiring region L. The second wiring 165 may be substantially superimposed over the first wiring 147.

In some exemplary embodiments, the second wiring 165 is in direct contact with the first wiring 147. As illustrated in FIG. 1, the second wiring may be in contact with the first wiring 147 through the second gate insulation layer 150. In this case, the second wiring 165 may make contact with the first wiring 147 via a first contact hole 165 formed through the second gate insulation layer 150.

The upper electrode 160 and the second wiring 165 may be formed of a metal such as Al, Ag, W, Cu, Ni, Cr, Mo, Ti, Pt, Ta, Nd or Sc, the alloy of these metals or the nitride of these metals. These may be used alone or in a combination thereof. Alternatively, the upper electrode 160 and the second wiring 165 may be formed of a transparent conductive material such as ITO, IZO or AZO. The upper electrode 160 and the second wiring 165 may have a multi-layered structure including at least two materials selected from the metal, the alloy, the metal nitride and the transparent conductive material. In some exemplary embodiments, the upper electrode 160 and the second wiring 165 include the same material.

In some exemplary embodiments, the capacitor is defined by the upper electrode 160, the second gate insulation layer 150 and the lower electrode 143.

The first and second wirings 147 and 165 may extend in the same direction. The first and second wirings 147 and 165 may serve as the gate line together. In this case, the first and second wiring 147 and 165 may make a parallel connection to reduce an electrical resistance of the gate line.

As the resolution of a display device such as an OLED device or an LCD device improves, widths of wirings decrease so that electrical resistance of the gate line increases to cause, e.g., a signal delay. Accordingly, side effects such as an irregular color expression or a low image quality may result. To reduce the electrical resistance of the gate line, the thickness of the wirings may increase. However, in this case, process efficiency may be reduced because more deposition time for a conductive material may be needed, and additionally a capacitance of the capacitor may be reduced.

According to exemplary embodiments, the second wiring 165 that may be located on the same layer or the same level as the upper electrode 160 of the capacitor may be electrically connected to the first wiring 147. Therefore, the electrical resistance of the gate line may be reduced without increasing the width and/or the thickness of the first wiring 147 serving as the gate line.

An insulation interlayer 170 may be formed on the second gate insulation layer 150 to cover the upper electrode 160 and the second wiring 165.

The insulating interlayer 170 may be formed of an insulating material such as silicon oxide, silicon nitride or silicon oxynitride. The insulating interlayer 170 may have a substantially even or leveled upper surface.

A source electrode 180 and a drain electrode 185 may be electrically connected to the first impurity region 112 and the second impurity region 114, respectively, through the insulating interlayer 170, the second gate insulation layer 150 and the first gate insulation layer 130.

The source and drain electrodes 180 and 185 may be formed of a metal such as Al, Ag, W, Cu, Ni, Cr, Mo, Ti, Pt, Ta, Nd or Sc, the alloy of these metals or the nitride of these metals. These may be used alone or in a combination thereof. Alternatively, the source and drain electrodes 180 and 185 may be formed of a transparent conductive material such as ITO, IZO or AZO. The source and drain electrodes 180 and 185 may have a single-layered structure or a multi-layered structure including a plurality of metal layers and/or transparent conductive layers.

In exemplary embodiments, the source electrode 180 may be electrically connected to or integrally formed with a data line (not illustrated). The drain electrode 185 may be electrically connected to a pixel electrode (not illustrated) when the display substrate is employed to a display device.

The switching device including the first TFT, the source electrode 180 and the drain electrode 185 may be defined on the switching device region SW. As illustrated above, the capacitor and the second TFT may be defined on the capacitor region CAP. Accordingly, the display substrate may include two TFTs and one capacitor in one pixel. However, the number of the TFT and the capacitor is not specifically limited. In some exemplary implementations, the display substrate includes at least three TFTs and at least two capacitors in one pixel.

In some exemplary embodiments, a pixel emitting by the switching device is selected by a signal of the gate line. The capacitor may be charged when the switching device is turned on. When a gate voltage of the second TFT exceeds a threshold voltage Vth according to a voltage generated in the capacitor, the second TFT may be turned on. Accordingly, a voltage may be applied to a light emitting structure of the display device so that a light may be generated from the light emitting structure.

According to some exemplary embodiments, the first and second wirings 147 and 165 are electrically connected to each other to serve as the gate line. Thus, the gate line may have a reduced resistance so that the display substrate or the display device may have improved signal transfer speed and/or operational speed.

Additionally, the second TFT and the capacitor may overlap with each other on the capacitor region CAP so that an area of the base substrate 100 or each pixel may be decreased. Furthermore, the lower electrode 143 may also serve as a gate electrode of the second TFT so that an additional capacitor line may be omitted. Thus, the display substrate may have a shortened signal transfer path.

FIGS. 2 to 6 are cross-sectional views illustrating a method of manufacturing the display substrate of FIG. 1.

Figure 2:
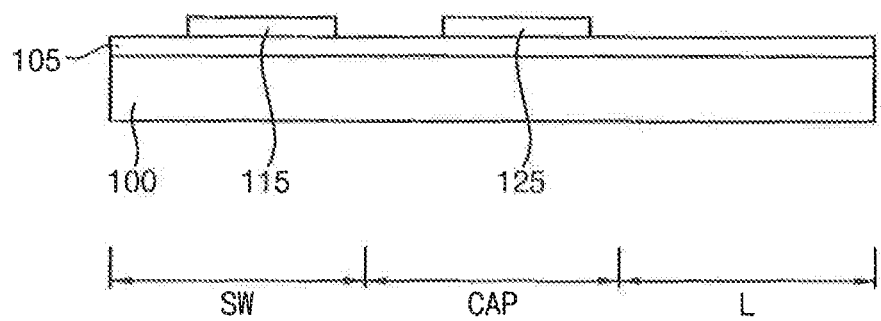

Referring to FIG. 2, a buffer layer 105, a first semiconductor layer 115 and a second semiconductor layer 125 may be sequentially formed on a base substrate 100.

The base substrate 100 may be formed of a glass substrate, a transparent plastic substrate such as a PET substrate, a PEN substrate or a polyimide substrate, or a transparent metal oxide substrate. In some exemplary embodiments, the base substrate 100 includes a switching device region SW, a capacitor region CAP and a wiring region L.

The buffer layer 105 may be formed on the base substrate 100 using, e.g., silicon oxide, silicon nitride or silicon oxynitride. The buffer layer 105 may be obtained by a chemical vapor deposition (CVD) process, a plasma enhanced chemical vapor deposition (PECVD) process, a high density plasma-chemical vapor deposition (HDP-CVD), etc.

The first semiconductor layer 115 and the second semiconductor layer 125 may be formed on the switching device region SW and the capacitor region CAP, respectively. In some exemplary embodiments, a semiconductor material layer is deposited on the buffer layer 105 by a sputtering process, a CVD process, a low pressure CVD (LPCVD) process, a vacuum evaporation process, etc. The semiconductor material layer may be patterned to form the first semiconductor layer 115 and the second semiconductor layer 125. The semiconductor material layer may be formed using amorphous silicon or polysilicon. In some exemplary implementation, an amorphous silicon layer is deposited and then crystallized by a laser crystallization process or a thermal crystallization process to form the semiconductor layer. Alternatively, the semiconductor material layer may be formed using an oxide semiconductor such as IGZO, ZTO or ITZO.

Figure 3:
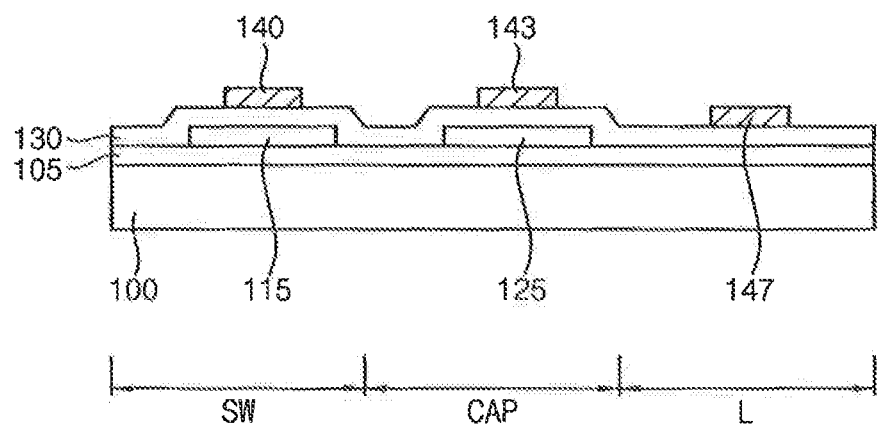

Referring to FIG. 3, a first gate insulation layer 130 covering the first and second semiconductor layers 115 and 125 is formed on the buffer layer 105. A gate electrode 140, a lower electrode 143 and a first wiring 147 may be formed on the first gate insulation layer 130.

The first gate insulation layer 130 may be formed using an insulation material such as silicon oxide, silicon nitride or silicon oxynitride. The first gate insulation layer 130 may be formed as a single-layered structure or a multi-layered structure including, e.g., a silicon oxide layer and a silicon oxynitride layer. The first gate insulation layer 130 may be obtained by a CVD process, a PECVD process, a spin coating process, a vacuum evaporation process, etc.

The first gate insulation layer 130 may be formed to have a thin thickness such that the first gate insulation layer 130 may include stepped portions or protruding portions at regions adjacent to the first and second semiconductor layers 115 and 125. Alternatively, the first gate insulation layer 130 may be formed to have a sufficiently thick thickness such that the first gate insulation layer 130 may have a substantially even or leveled upper surface.

The gate electrode 140, the lower electrode 143 and the first wiring 147 may be formed on the switching device region SW, the capacitor region CAP and the wiring region L, respectively.

In some exemplary embodiments, the first conductive layer is formed on the first gate insulation layer 130, and then the first conductive layer is patterned to form the gate electrode 140, the lower electrode 143 and the first wiring 147. The gate electrode 140, the lower electrode 143 and the first wiring 147 may be obtained through an etching process utilizing a single mask.

The first conductive layer may be formed using a metal such as Al, Ag, W, Cu, Ni, Cr, Mo, Ti, Pt, Ta, Nd or Sc, an alloy of these metals, or a nitride of these metals. Alternatively, the first conductive layer may be formed using a transparent conductive material such as ITO, IZO or AZO. The first conductive layer may be formed as a single-layered structure or a multi-layered structure including at least two materials among the metal, the alloy, the nitride and the transparent conductive material. The first conductive layer may be obtained by a sputtering process, an atomic layer deposition (ALD) process, a pulse laser deposition (PLD) process, a vacuum evaporation process, etc.

In some exemplary embodiments, the first wiring 147 serves as a gate line of the display substrate. In this case, the first wiring 147 may be electrically connected to or integrally formed with the gate electrode 140.

Figure 4:
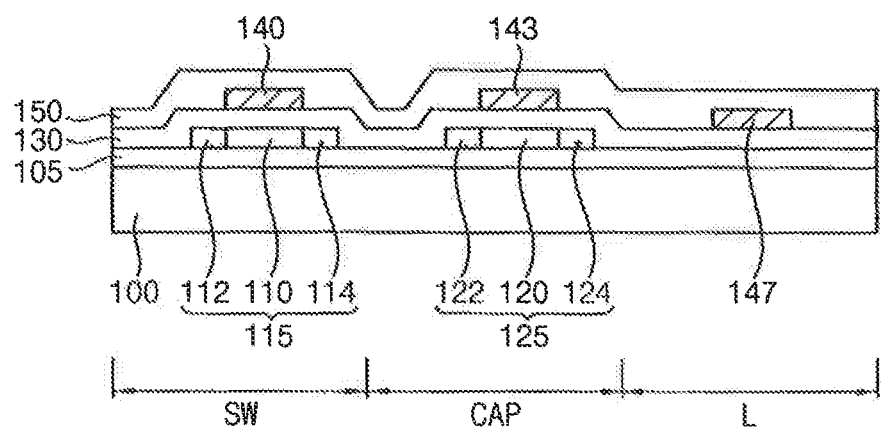

Referring to FIG. 4, p-type or n-type dopants are implanted into the first and second semiconductor layers 115 and 125. Thus, a first impurity region 112 and a second impurity region 114 may be formed at both ends of the first semiconductor layer 115, and a third impurity region 122 and a fourth impurity region 124 may be formed at both end of the second semiconductor layer 125. In some exemplary embodiments, the gate electrode 140 is utilized as an implantation mask while forming the first and second impurity regions 112 and 114. The lower electrode 143 may be utilized as an implantation mask while forming the third and fourth impurity regions 122 and 124.

A portion of the first semiconductor layer 115 between the first and second impurity regions 112 and 114 may be defined as a first channel portion 110. A portion of the second semiconductor layer 125 between the third and fourth impurity regions 122 and 124 may be defined as a second channel portion 120. The first channel portion 110 and the second channel portion 120 may substantially overlap with the gate electrode 140 and the lower electrode 143, respectively.

By forming the first to fourth impurity regions 112, 114, 122 and 124, a first TFT including the gate electrode 140, the first gate insulation layer 130 and the first semiconductor layer 115 may be defined on the switching device region SW. A second TFT including the lower electrode 143, the first gate insulation layer 130 and the second semiconductor layer 125 may be defined on the capacitor region CAP.

In one exemplary embodiment, in the case that the first and second semiconductor layers 115 and 125 are formed using the oxide semiconductor, the first to fourth impurity regions 112, 114, 122 and 124 may be omitted.

A second gate insulation layer 150 covering the gate electrode 140, the lower electrode 143 and the first wiring 147 may be formed on the first gate insulation layer 130.

The second gate insulation layer 150 may be formed using an insulation material such as silicon oxide, silicon nitride or silicon oxynitride. The second gate insulation layer 150 may be formed as a single-layered structure or a multi-layered structure including, e.g., a silicon oxide layer and a silicon oxynitride layer. The second gate insulation layer 150 may be obtained by a CVD process, a PECVD process, a spin coating process, a vacuum evaporation process, etc.

The second gate insulation layer 150 may be formed to have a thin thickness such that the second gate insulation layer 150 may include stepped portions or protruding portions at regions adjacent to the gate electrode 140 and the lower electrode 143 as illustrated in FIG. 4. Alternatively, the second gate insulation layer 150 may be formed to have a sufficiently thick thickness such that the second gate insulation layer 150 may have a substantially even or leveled upper surface.

Figure 5:
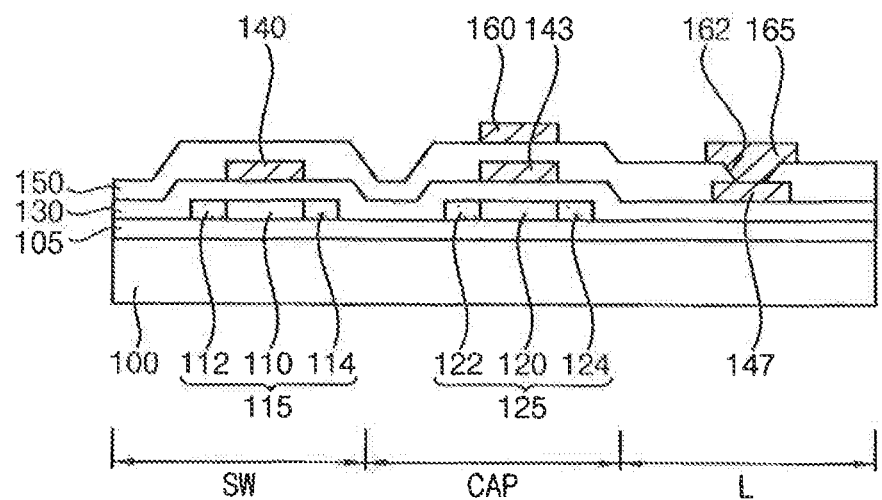

Referring to FIG. 5, an upper electrode 160 and a second wiring 165 are formed on the second gate insulation layer 150. In some exemplary embodiments, the upper electrode 160 is formed on the capacitor region CAP. The upper electrode 160 is substantially superimposed over the lower electrode 143. The second wiring 165 may be formed on the wiring region L and may be electrically connected to the first wiring 147.

In some exemplary embodiments, the second gate insulation layer 150 is partially etched to form a first contact hole 162 at least partially exposing the first wiring 147. A second conductive layer filling the first contact hole 162 may be formed on the second gate insulation layer 150, and then the second conductive layer may be patterned to form the upper electrode 160 and the second wiring 165. The upper electrode 160 and the second wiring 165 may be obtained through an etching process utilizing a single mask.

The second conductive layer may be formed using a metal such as Al, Ag, W, Cu, Ni, Cr, Mo, Ti, Pt, Ta, Nd or Sc, an alloy of these metals, or a nitride of these metals. Alternatively, the second conductive layer may be formed using a transparent conductive material such as ITO, IZO or AZO. The second conductive layer may be formed as a single-layered structure or a multi-layered structure including at least two materials among the metal, the alloy, the nitride and the transparent conductive material. The second conductive layer may be obtained by a sputtering process, an ALD process, a PLD process, a vacuum evaporation process, etc.

By forming the upper electrode 160, a capacitor may be defined by the upper electrode 160, the second gate insulation layer 150 and the lower electrode 143. In some exemplary embodiments, the first wiring 147 and the second wiring 165 extend in substantially the same direction and may serve as the gate line together.

In some exemplary embodiments, the second wiring 165 is formed by the patterning process the same as that for the upper electrode 160. Further, the second wiring 165 may make contact with the first wiring 147 so that an electrical resistance of the gate line may be reduced. Therefore, additional deposition and/or patterning processes may not be performed in order to reduce a resistance of the first wiring 147.

Figure 6:
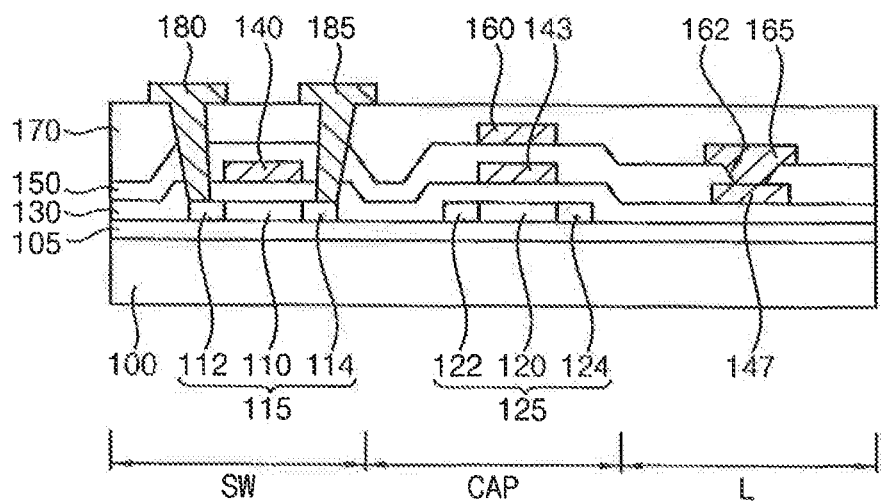

Referring to FIG. 6, an insulating interlayer 170 covering the upper electrode 160 and the second wiring 165 are formed on the second gate insulation layer 150. A source electrode 180 and a drain electrode 185 may be formed through the insulating interlayer 170, the second gate insulation layer 150 and the first gate insulation layer 130. The source electrode 180 and the drain electrode 185 may make contact with the first impurity region 112 and the second impurity region 114, respectively.

The insulating interlayer 170 may be formed using an insulating material such as silicon oxide, silicon nitride or silicon oxynitride by a CVD process, a PECVD process, a spin coating process, a vacuum evaporation process, etc. The insulating interlayer 170 may have a sufficiently thick thickness to have a substantially even or leveled upper surface. In one exemplary embodiment, a planarization process is further performed with respect to the upper surface of the insulating interlayer 170.

The insulating interlayer 170, the second gate insulation layer 150 and the first gate insulation layer 130 may be partially etched to form openings through which the first and second impurity regions 112 and 114 may be exposed. A third conductive layer filling the openings may be formed on the insulating interlayer 170, and then the third conductive layer may be patterned to form the source electrode 180 and the drain electrode 185. The source electrode 180 and the drain electrode 185 may be in direct contact with the first impurity region 112 and the second impurity region 114, respectively.

In some exemplary embodiments, the source electrode 180 and the drain electrode 185 is formed by a patterning process the same as that for a data line (not illustrate) of the display substrate. In this case, the source electrode 180 may be integrally formed with the data line.

By forming the source electrode 180 and the drain electrode 185, a switching device including the first TFT, the source electrode 180 and the drain electrode 185 may be defined on the switching device region SW.

Figure 7A:
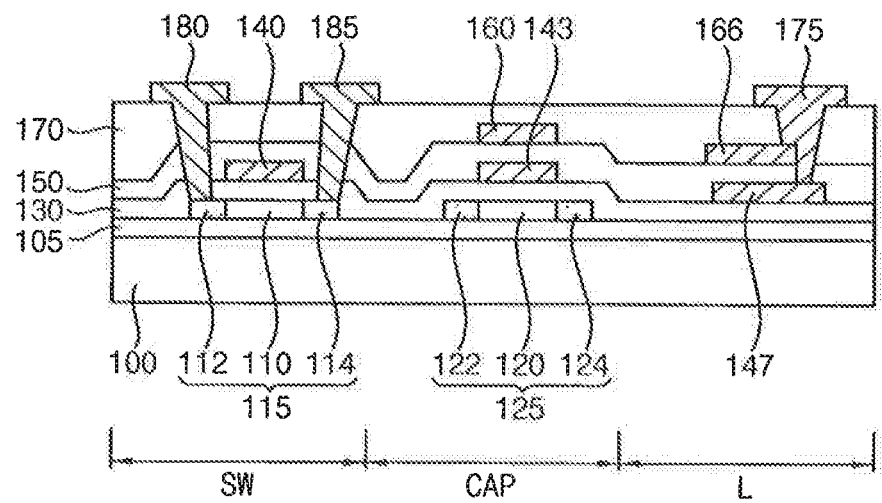
FIGS. 7A and 7B are cross-sectional views illustrating another display substrate in accordance with some exemplary embodiments.
Figure 7B:
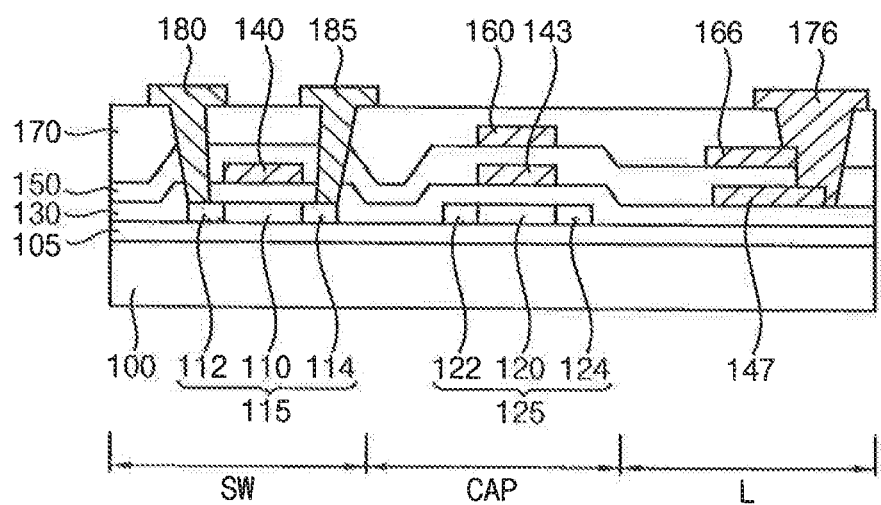

FIGS. 7A and 7B are cross-sectional views illustrating display substrates in accordance with some exemplary embodiments. Detailed descriptions on elements and/or constructions substantially the same as or similar to those illustrated with reference to FIG. 1 are omitted. Like reference numerals are used to refer to like elements.

Referring to FIG. 7A, a base substrate 100 may include a switching device region SW, a capacitor region CAP and a wiring region L as illustrated in FIG. 1.

A first TFT including a first semiconductor layer 115, a first gate insulation layer 130 and a gate electrode 140 may be defined on the switching device region SW. A second gate insulation later 150 may cover the gate electrode 140. An insulating interlayer 170 may be formed on the second gate insulation layer 150. A source electrode 180 and a drain electrode 185 may be in contact with a first impurity region 112 and a second impurity region 114 of the first semiconductor layer 115, respectively, through the insulating interlayer 170, the second gate insulation layer 150 and the first gate insulation layer 130. The first TFT, the source electrode 180 and the drain electrode 185 may define a switching device.

A second TFT including a second semiconductor layer 125, the first gate insulation layer 130 and a lower electrode 143 may be defined on the capacitor region CAP, and the lower electrode 143, the second gate insulation layer 150 and an upper electrode 160 may define a capacitor.

A first wiring 147 may be formed on the first gate insulation layer 130 of the wiring region L. The first wiring 147 may be patterned simultaneously with the gate electrode 140 and the lower electrode 143, and the first wiring 147 may be formed of the same conductive material as those of the gate electrode 140 and the lower electrode 143. The first wiring 147 may serve as a gate line of the display substrate, and may be electrically connected or integrally formed with the gate electrode 140.

A second wiring 166 may be formed on the second gate insulation layer 150 to be at least partially superimposed over the first wiring 147. In one exemplary embodiment, the second wiring 166 has a width or a diameter smaller than that of the first wiring 147. In another exemplary embodiment, the second wiring 166 is partially superimposed over the first wiring 147. In some exemplary implementations, the first wiring 147 and the second wiring 166 have a staggered arrangement.

The second wiring 166 may be electrically connected to the first wiring 147. In some exemplary embodiments, a via structure 175 is formed through the insulating interlayer 170 and the second gate insulation layer 150 to make an electrical connection between the first wiring 147 and the second wiring 166. The via structure 175 may be patterned simultaneously with the source electrode 180 and the drain electrode 185. The via structure 175 may be formed of the same conductive material as those of the source electrode 180 and the drain electrode 185.

As illustrated in FIG. 7A, the via structure 175 is in contact with portions of a top surface and a lateral surface of the second wiring 166 and in contact with a portion of a top surface of the first wiring 147. In some exemplary implementations, a bottom surface of the via structure 175 is landed on the top surface of the first wiring 147. A width or a diameter of the via structure 175 may be decreased discontinuously from a contact portion with the second wiring 166.

Referring to FIG. 7B, a bottom surface of the via structure 176 also is in contact with the first gate insulation layer 130.

In this case, the via structure 176 may make contact with portions of the top surface and a lateral surface of the first wiring 147.

The via structure 176 illustrated in FIG. 7B has a width or a diameter greater than that of the via structure 175 illustrated in FIG. 7A, and the via structure 176 may have larger contact areas with the first and second wirings 147 and 166 than those of the via structure 175.

As described above, the via structures 175 and 176 may make parallel connection between the first and second wirings 147 and 166. Thus, an electrical resistance of a signal wiring such as the gate line may be reduced without increasing a width or a thickness of the first wiring 147.

FIGS. 8 to 11B are cross-sectional views illustrating a method of manufacturing the display substrates of FIGS. 7A and 7B. Detailed descriptions on processes and/or materials substantially the same as or similar to those illustrated with reference to FIGS. 2 to 6 are omitted.

Figure 8:
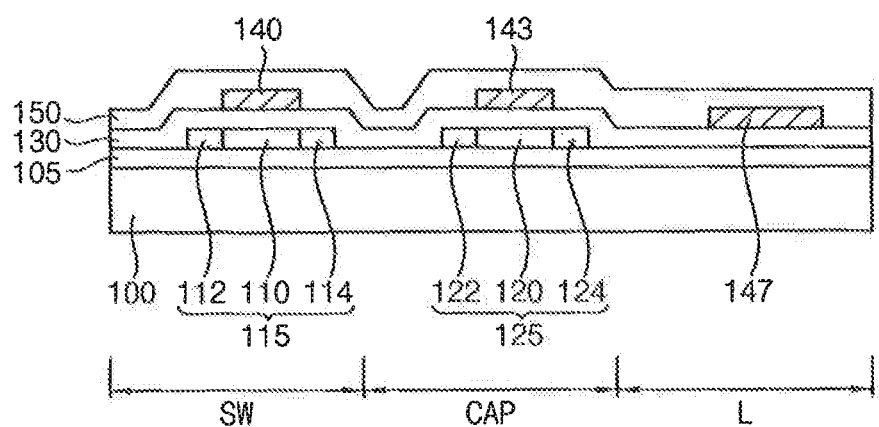

Referring to FIG. 8, processes substantially the same as or similar to those illustrated with reference to FIGS. 2 to 4 are performed. Accordingly, a buffer layer 105 may be formed on a base substrate 100, and a first semiconductor layer 115 and a second semiconductor layer 125 may be formed on the buffer layer 105. A first gate insulation layer 130 may be formed on the buffer layer 105 to cover the first and second semiconductor layers 115 and 125, and a gate electrode 140, a lower electrode 143 and a first wiring 147 may be formed on the first gate insulation layer 130. A second gate insulation layer 150 may be formed on the first gate insulation layer 130 to cover the gate electrode 140, the lower electrode 143 and the first wiring 147.

Figure 9:
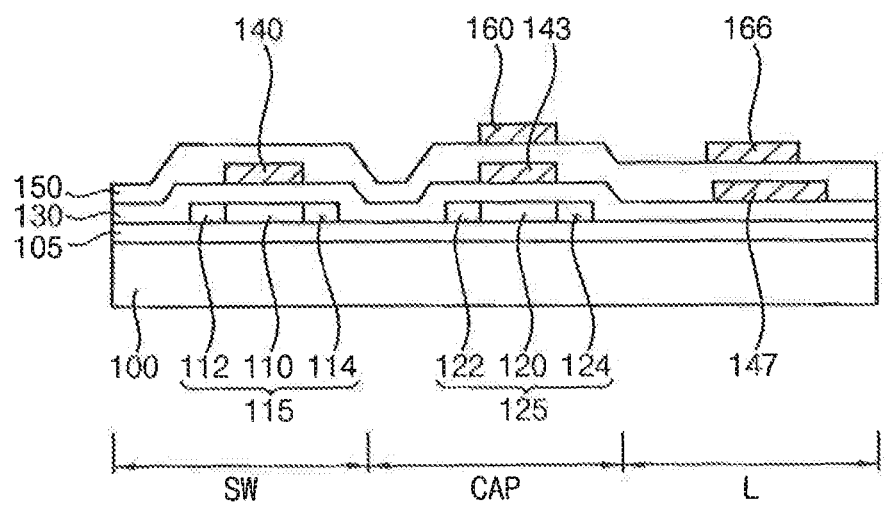

Referring to FIG. 9, an upper electrode 160 and a second wiring 166 are formed on the second gate insulation layer 150. The upper electrode 160 and the second wiring 166 may be substantially superimposed over the lower electrode 143 and the first wiring 147, respectively. In one exemplary embodiment, the second wiring 166 may have a width or a diameter smaller than that of the first wiring 147. In one exemplary embodiment, the second wiring 166 may be partially superimposed over the first wiring 147, and may have a staggered arrangement with the first wiring 147.

Figure 10A:
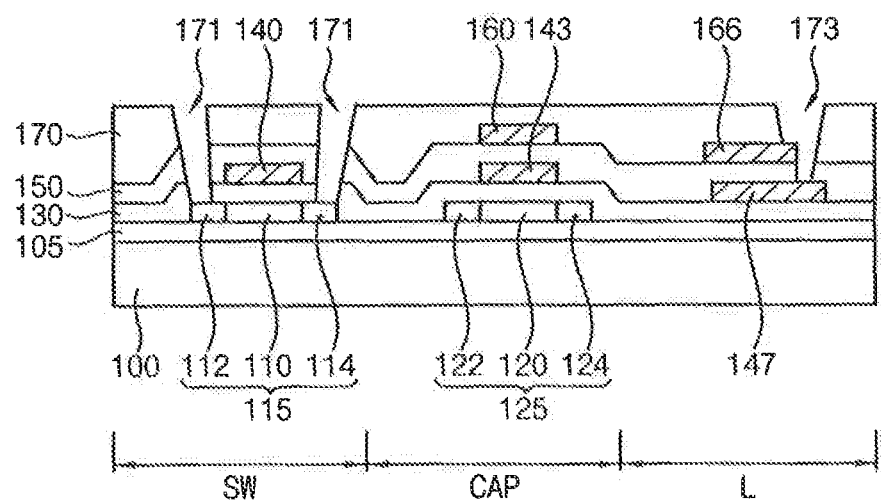
FIG. 10A is a cross-sectional view illustrating an insulation layer and a first opening formed as part of a method of manufacturing the display substrates of FIGS. 7A and 7B according to an embodiment.

Referring to FIG. 10A, an insulating interlayer 170 covering the upper electrode 160 and the second wiring 166 may be formed on the second gate insulation layer 150. The insulating interlayer 170, the second gate insulation layer 150 and/or the first gate insulation layer 130 may be partially etched to form first openings 171 and a second opening 173.

In some exemplary embodiments, the first openings 171 is formed through the insulating interlayer 170, the second gate insulation layer 150 and the first gate insulation layer 130 to at least partially expose the first and second impurity regions 112 and 114. The second opening 173 may be formed through the insulating interlayer 170 and the second gate insulation layer 150 to partially expose a top surface of the first wiring 147.

In some other exemplary embodiments, the first and second openings 171 and 173 are formed by the same dry or wet etching processes utilizing a single mask. In some exemplary implementations, the first and second openings 171 and 173 are formed simultaneously by the same etching gas or etching solution. In this case, the first semiconductor layer 115 and the first wiring 147 may substantially serve as an etch stopper.

The second wiring 166 may protrude into the second opening 173. In this case, the second wiring 173 may serve as an etching mask, and a width or a diameter of the second opening 173 may be decreased discontinuously from a top surface of the second wiring 166.

Figure 10B:
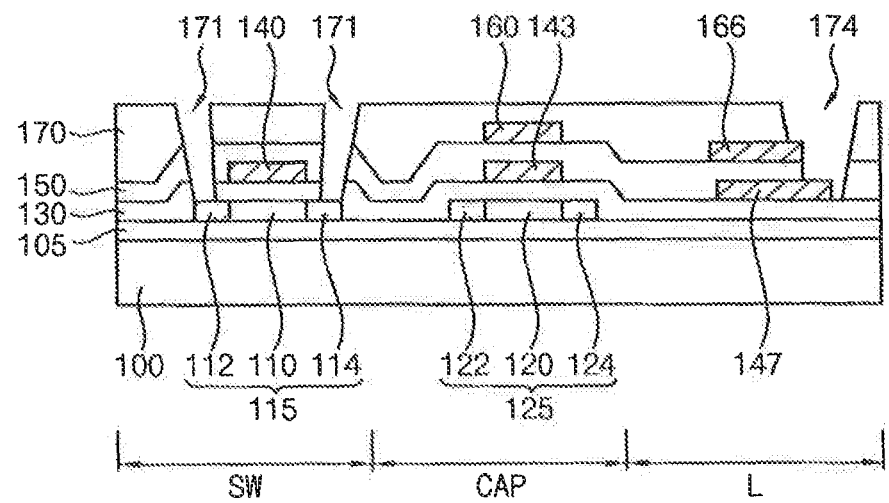
FIG. 10B is a cross-sectional view illustrating a second opening formed as part of a method of manufacturing the display substrates of FIGS. 7A and 7B according to an embodiment.

In one exemplary embodiment, as illustrated in FIG. 10B, a second opening 174 partially exposes the top surface and a lateral surface of the first wiring 147, and further expose a top surface of the first gate insulation layer 130. In this case, the second opening 174 may be formed to have a relatively larger width or diameter, so that an alignment tolerance of the second opening may increase.

As described above, the second wiring 166 may have the width or the diameter smaller than that of the first wiring 147, or the first and second wirings 147 and 166 may have the staggered arrangement. Thus, both of the first and second wirings 147 and 166 may be partially exposed by the second opening.

Figure 11A:
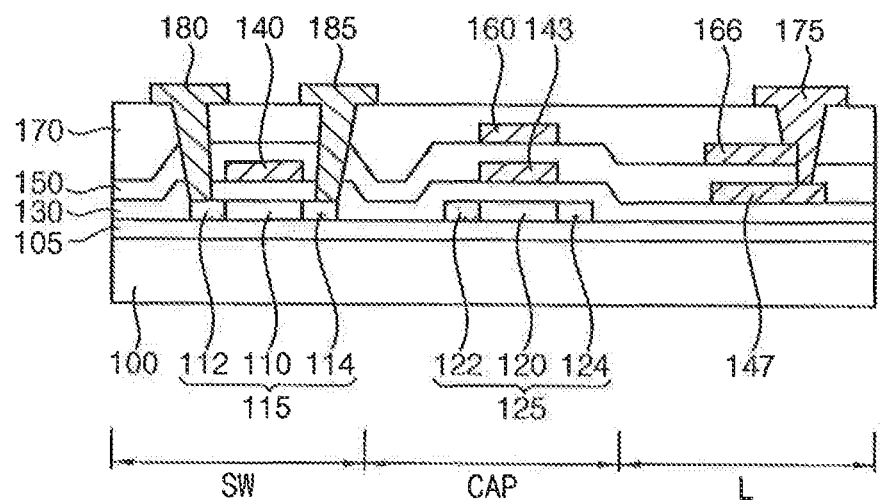
FIG. 11A is a cross-sectional view illustrating source and drain electrodes and a via structure formed as part of a method of manufacturing the display substrates of FIGS. 7A and 7B according to an embodiment.

Referring to FIG. 11A, a source electrode 180, a drain electrode 185 and a via structure 175 filling the first and second openings 171 and 173 are formed on the insulating interlayer 170.

The source electrode 180 and the drain electrode 185 may fill the first openings 171 to be electrically connected to the first impurity region 112 and the second impurity region 114, respectively. The via structure 175 may be in contact with portions of the second wiring 166 and the first wiring 147 exposed by the second opening 173 such that the first and second wirings 147 and 166 may be electrically connected to each other by the via structure 175. In some exemplary embodiments, a conductive layer filling the first and second openings 171 and 173 are formed on the insulating interlayer 170, and then the conductive layer may be patterned to form the source electrode 180, the drain electrode 185 and the via structure 175. In this case, the source electrode 180, the drain electrode 185 and the via structure 175 may be formed simultaneously.

In some exemplary embodiments, the via structure 175 is in contact with portions of top and lateral surfaces of the second wiring 166, and in contact with the top surface of the first wiring 147. The via structure 175 may be landed on the top surface of the first wiring 147. A width or a diameter of the via structure 175 may be decreased discontinuously from a contact portion with the second wiring 166.

Figure 11B:
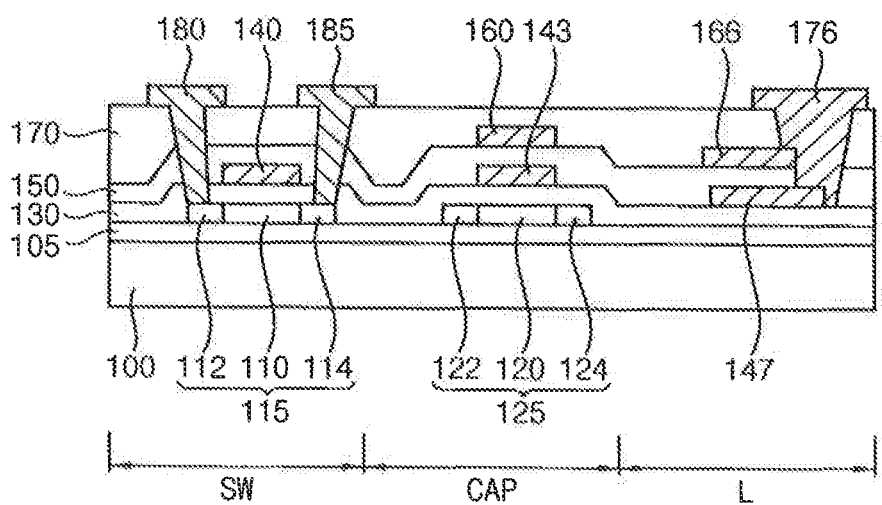
FIG. 11B is a cross-sectional view illustrating a bottom surface of a via structure extending to the top surface of a gate insulation layer formed as part of a method of manufacturing the display substrates of FIGS. 7A and 7B according to an embodiment.

Referring to FIG. 11B, a bottom surface of a via structure 176 extends to the top surface of the first gate insulation layer 130. In some exemplary implementations, the via structure 176 is in contact with the portions of the top and lateral surfaces of the first wiring 147, and also in contact with the top surface of the first gate insulation layer 130.

According to some exemplary embodiments, the second wiring 166 is formed together with the upper electrode 160 of the capacitor, and the via structure 176 may be formed together with the source electrode 180, the drain electrode 185 and a date line (not illustrated) by the same patterning process. Therefore, an electrical resistance of the first wiring 147 may be efficiently reduced without performing additional deposition and/or patterning processes.

Figure 12:
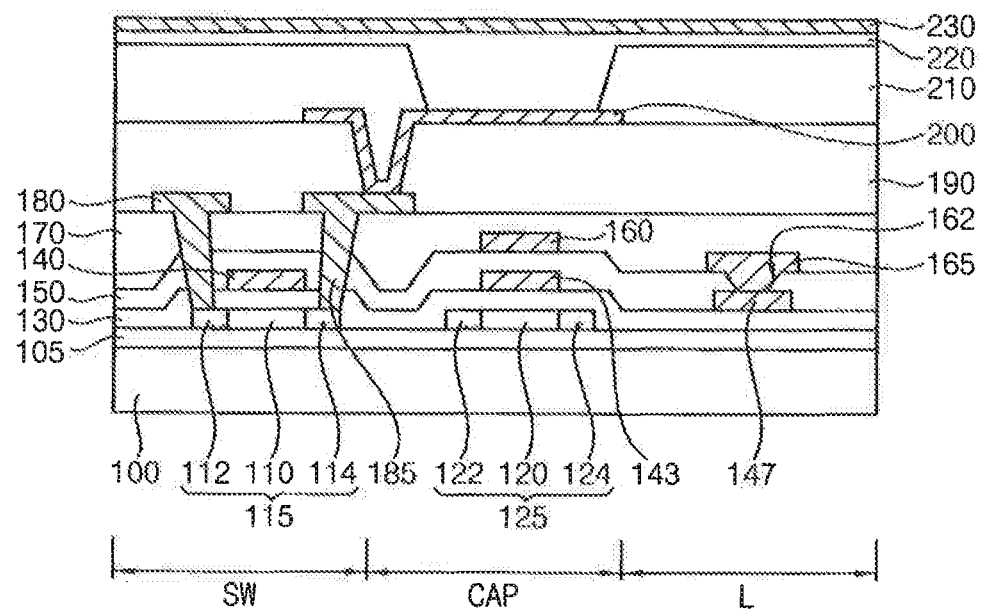

FIG. 12 is a cross-sectional view illustrating a display device in accordance with some exemplary embodiments. According to some exemplary implementations, FIG. 12 illustrates an OLED device including the display substrate as described above. However, the display substrate is employed to other types of display devices such as an LCD device or a flexible display device according to some exemplary embodiments. Detailed descriptions on elements and/or constructions substantially the same as or similar to those illustrated with reference to FIG. 1 are omitted. Like reference numerals are used to refer to like elements.

Referring to FIG. 12, the display device includes the display substrate according to some exemplary embodiments and an organic light emitting structure electrically connected to the display substrate.

As illustrated in FIG. 1, the display substrate includes a buffer layer 105, a first semiconductor layer 115, a second semiconductor layer 125, a first gate insulation layer 130, a gate electrode 140, a lower electrode 143, a first wiring 147, a second gate insulation layer 150, an upper electrode 160, a second wiring 165, an insulating interlayer 170, a source electrode 180 and a drain electrode 185. The drain electrode 185 may be formed on a base substrate 100.

A switching device including the first semiconductor layer 115, the first gate insulation layer 130, the gate electrode 140, the source electrode 180 and the drain electrode 185 may be defined on a switching device region SW. The switching device may include a first TFT. A second TFT and a capacitor may be defined by the second semiconductor layer 125, the lower electrode 143, the second gate insulation layer 150 and the upper electrode 160 on a capacitor region CAP. The second wiring 165 may be in contact with the first wiring 147 via a first contact hole 162 on a wiring region L.

In some exemplary embodiments, the first wiring 147 serves as a gate line of the display device. The source electrode 180 may be electrically connected to a data line (not illustrated) of the display device.

In one exemplary embodiment, the display substrate has a structure or a construction substantially the same as or similar to that illustrated with reference to FIGS. 7A and 7B.

A planarization layer 190 may be formed on the insulating interlayer 170 to cover the source electrode 180 and the drain electrode 185. The planarization layer 190 may be formed of an organic material such as an acryl-based resin, a polyimide-based resin, a siloxane-based resin or benzocyclobutene (BCB).

The organic light emitting structure may be formed on the planarization layer 170 to be electrically connected to the drain electrode 185. The organic light emitting structure may include a first electrode 200, a pixel defining layer (PDL) 210, an organic light emitting layer (EML) 220 and a second electrode 230.

The first electrode 200 may be electrically connected to the drain electrode 185 through the planarization layer 190. The first electrode 200 may be formed of a transparent conductive material such as ITO, ZTO, IZO, zinc oxide or tin oxide, a metal such as Cr, Al, Ta, Mo, Ti, W, Cu, Ag or Nd, or an alloy of these metals. The first electrode 200 may serve as a pixel electrode and/or an anode of the display device.

The PDL 210 may be formed on the planarization layer 190 to cover peripheral portions of the first electrode 200. The PDL 210 may define a pixel region of the display device, and a portion of the first electrode 200 not covered by the PDL 210 may substantially correspond to an area of the pixel region. The PDL 210 may be formed of a photosensitive material such as polyimide resin or acryl resin. Alternatively, the PDL 210 may be formed of a non-photosensitive organic material or an inorganic material.

The EML 220 may be formed on the PDL 210 and the first electrode 200 exposed by the PDL 210. In one exemplary embodiment, a hole transport layer (HTL) (not illustrated) may be further formed between the first electrode 200 and the EML 220.

The EML 220 may include at least one of light emitting materials for generating different colors of light, such as, a red color of light, a green color of light or a blue color of light. In one exemplary embodiment, the EML 220 may include a mixture of the light emitting materials for generating a white color of light.

The HTL may include a hole transport material, such as, 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole or a mixture thereof.

As illustrated in FIG. 12, the EML 220 is formed continuously on surfaces of the PDL 210 and the first electrode 200. Alternatively, the EML 220 may be confined by sidewalls of the PDL 210.

The second electrode 230 may be formed on the EML 220. The second electrode 230 may be formed of a metal such as lithium (Li), calcium (Ca), lithium fluoride/calcium (LiF/Ca), LiF/Al, Al, Mg, Ag, Cr, W, Mo or Ti and an alloy thereof. In one exemplary embodiment, the second electrode 230 may be formed of a transparent conductive material such as ITO, IZO, ZTO, tin oxide or zinc oxide. The second electrode 230 may serve as a cathode of the display device.

The second electrode 230 may be formed continuously on a substantially entire surface of the display device to serve as a common electrode. Alternatively, the second electrode 230 may be patterned in each pixel. In this case, the second electrode 230 may be confined by the sidewalls of the PDL 210 together with the EML 220.

In one exemplary embodiment, an electron transport layer (ETL) (not illustrated) may be further formed between the second electrode 230 and the EML 220. The ETL may be formed of an electron transport material, such as, tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP) or a mixture thereof.

Additionally, a passivation layer, an optical sheet, a polarized film and an upper transparent substrate may be optionally formed on the second electrode 230.

FIGS. 13 to 16 are cross-sectional views illustrating a method of manufacturing the display device of FIG. 12. Detailed descriptions on processes and/or materials substantially the same as or similar to those illustrated with reference to FIGS. 2 to 6 or FIGS. 8 to 11B are omitted.

Figure 13:
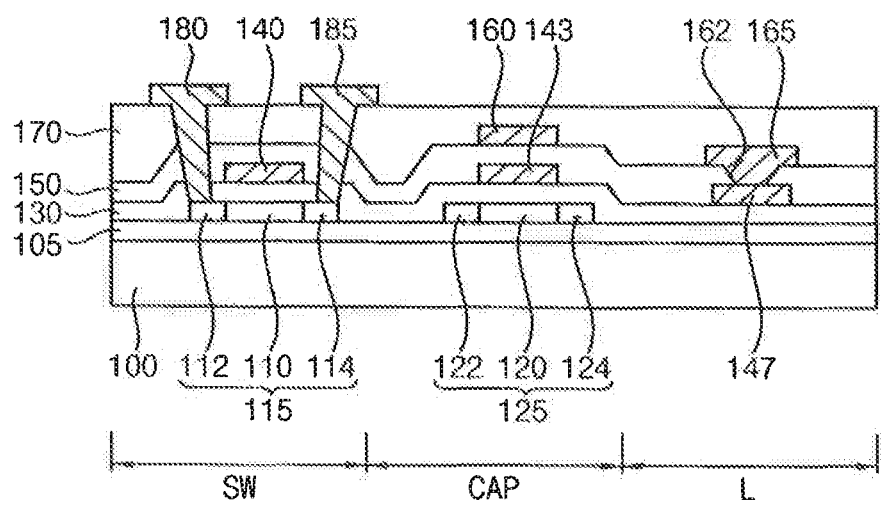

Referring to FIG. 13, processes substantially the same as or similar to those illustrated with reference to FIGS. 2 to 6 may be performed to form the display substrate according to some exemplary embodiments.

In one exemplary embodiment, the display substrate may be obtained by processes substantially the same as or similar to those illustrated with reference to FIGS. 8 to 11B.

Figure 14:
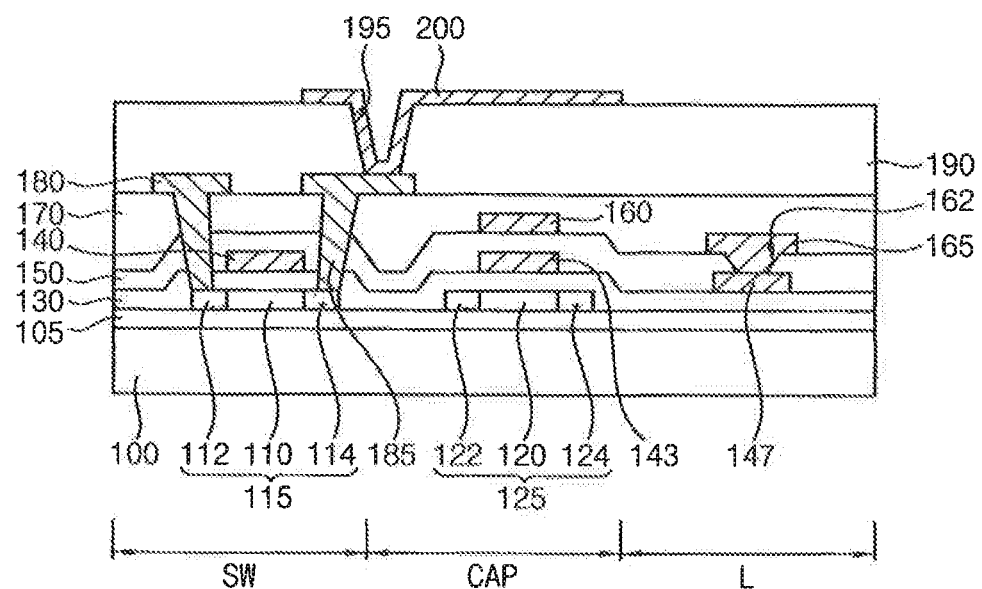

Referring to FIG. 14, a planarization layer 190 covering the source electrode 180 and the drain electrode 185 is formed on the insulating interlayer 170. A first electrode 200 may be formed through the planarization layer 190 to be electrically connected to the drain electrode 185.

The planarization layer 190 may be formed using an organic material such as an acryl-based resin, a polyimide-based resin, a siloxane-based resin or BCB. The planarization layer 190 may be formed by a CVD process, a spin coating process, a vacuum evaporation process, etc.

The planarization layer 190 may be partially removed to form a second contact hole 195 at least partially exposing a top surface of the drain electrode 185. A conductive layer may be formed on the planarization layer 190, sidewalls of the contact hole 195 and a bottom surface of the contact hole 195. The conductive layer may be patterned to form the first electrode 200. The conducive layer may be formed using a transparent conductive material such as ITO, ZTO, IZO, zinc oxide or tin oxide, a metal such as Cr, Al, Ta, Mo, Ti, W, Cu, Ag or Nd, or an alloy of the metals. The conductive layer may be obtained by a sputtering process, a CVD process, an ALD process, a vacuum evaporation process, a printing process, etc. In one exemplary embodiment, the conductive layer may be formed to completely fill the second contact hole 195.

Figure 15:
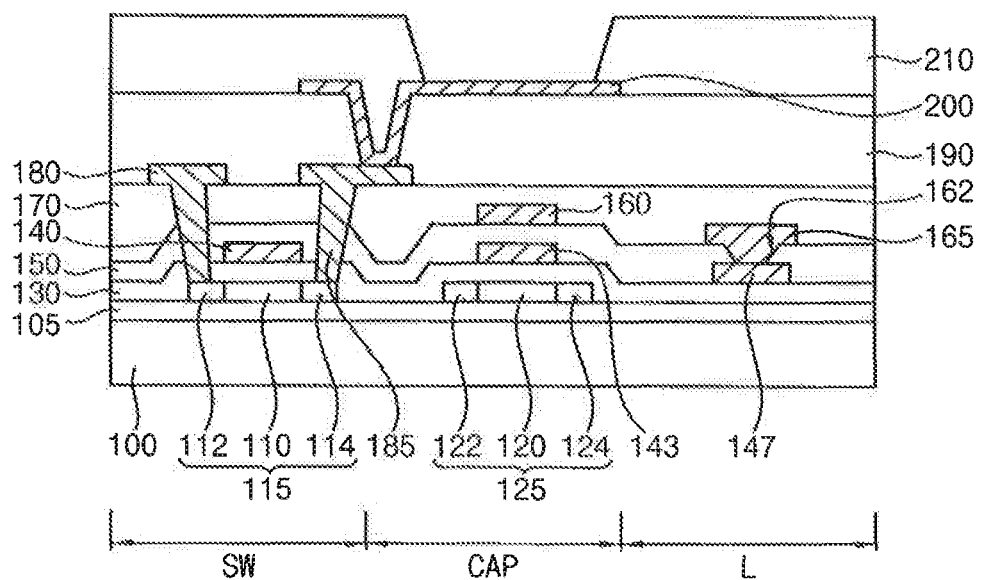

Referring to FIG. 15, a PDL 210 covering peripheral portions of the first electrode 200 is formed on the planarization layer 190 to define a pixel region of the display device.

In some exemplary implementations, a photosensitive material layer including, e.g., acryl resin, polyimide resin or BCB is formed on the planarization layer 190 and the first electrode 200. The photosensitive material layer may be patterned by an exposure process and a developing process to form the PDL 210. Alternatively, non-photosensitive organic or inorganic layers may be formed on the planarization layer 190 and the first electrode 200, and then the non-photosensitive organic or inorganic layers may be partially etched to form the PDL 210.

Figure 16:
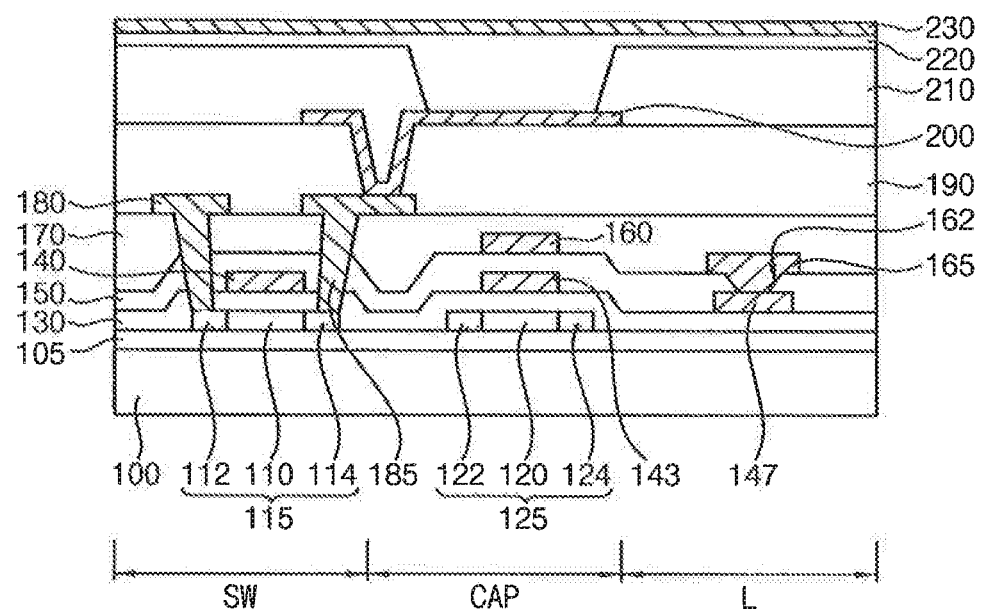

Referring to FIG. 16, an EML 220 and a second electrode 230 are sequentially formed on the PDL 210 and the first electrode 200.

The EML 220 may be formed using at least one of light emitting materials for generating different colors of light, such as, a red color of light, a green color of light or a blue color of light. In one exemplary embodiment, the EML 220 is formed using a mixture of the light emitting materials for generating a white color of light. The EML 220 may be formed by a spin coating process, a roll printing process, a nozzle printing process, an inkjet printing process, a transfer process using a donor substrate, etc.

The EML 220 may be formed continuously on surfaces of the PDL 210 and the first electrode 200 as illustrated in FIG. 16. Alternatively, the EML 220 may be patterned to be confined by sidewalls of the PDL 210.

In one exemplary embodiment, an HTL is further formed between the EML 220 and the first electrode 200 using the above mentioned hole transport material. In one exemplary embodiment, an ETL is further formed on the EML 220 using the above mentioned electron transport material. The HTL and the ETL may be formed by a spin coating process, a roll printing process, a nozzle printing process, an inkjet printing process, a transfer process using a donor substrate, etc.

The second electrode 230 may be formed using a metal such as Li, Ca, LiF/Ca, LiF/Al, Al, Mg, Ag, Cr, W, Mo or Ti, or an alloy thereof. In one exemplary embodiment, the second electrode 230 is formed using a transparent conductive material such as ITO, IZO, ZTO, tin oxide or zinc oxide. The second electrode 230 may be obtained by a sputtering process, a CVD process, an ALD process, a vacuum evaporation process, a printing process, etc.

The second electrode 230 may be formed continuously on a substantially entire surface of the display device. Alternatively, the second electrode 230 may be patterned in each pixel.

Additionally, a passivation layer, an optical sheet, a polarized film and an upper transparent substrate may be optionally formed on the second electrode to manufacture the display device.

According to some exemplary embodiments of the disclosed technology, a gate line may be formed as a multi-stacked structure including parallelly connected wirings. Therefore, an electrical resistance of the gate line may be reduced so that an operational speed and a signal transfer speed of a display substrate and/or a display device may be improved.

For purposes of summarizing the disclosed technology, certain aspects, advantages and novel features of the disclosed technology have been described herein. It is to be understood that not necessarily all such advantages is achieved in accordance with any particular embodiment of the disclosed technology. Thus, the disclosed technology is embodied or carried out in a manner that achieves or optimizes one advantage or group of advantages as taught herein without necessarily achieving other advantages as is taught or suggested herein.

Various modifications of the above described embodiments will be readily apparent, and the generic principles defined herein is applied to other embodiments without departing from the spirit or scope of the disclosed technology. Thus, the disclosed technology is not intended to be limited to the embodiments shown herein but is to be accorded the widest scope consistent with the principles and novel features disclosed herein.

The foregoing is illustrative of some exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a display substrate, comprising:
    forming a first semiconductor layer on a base substrate;
    forming a first gate insulation layer to cover the first semiconductor layer on the base substrate;
    forming a gate electrode and a first wiring on the first gate insulation layer, wherein the gate electrode and the first wiring are electrically connected to each other;
    forming a second gate insulation layer to cover the gate electrode and the first wiring;
    forming a second wiring on the second gate insulation layer, the second wiring being formed over the first wiring and electrically connected to the first wiring;
    forming a source electrode and a drain electrode, the source and drain electrodes being electrically connected, through the second and first gate insulation layers, to the first semiconductor layer;
    forming a lower electrode on the first gate insulation layer;
    forming an upper electrode on the second gate insulation layer, the upper electrode being formed over the lower electrode, wherein the upper electrode is disposed on a layer different from that of at least one of the source electrode or the drain electrode; and
    forming a via structure electrically connecting the first and second wirings to each other, wherein a portion of the via structure is disposed above the second wiring,
    wherein the lower electrode, the gate electrode and the first wiring are formed by the same etching process and wherein the upper electrode and the second wiring are formed by the same etching process.

2. The method of claim 1, wherein the via structure is formed simultaneously with the source electrode and the drain electrode.

3. The method of claim 1, wherein the first wiring and the second wiring form a gate line.

4. The method of claim 1, wherein the via structure contacts an edge of the second wiring.

5. A method of manufacturing a display substrate, comprising:
    forming a first semiconductor layer on a base substrate;
    forming a first gate insulation layer to cover the first semiconductor layer on the base substrate;
    forming a gate electrode and a first wiring on the first gate insulation layer;
    forming a second gate insulation layer to cover the gate electrode and the first wiring;
    forming a second wiring on the second gate insulation layer, the second wiring being formed over the first wiring and electrically connected to the first wiring; and
    forming a source electrode and a drain electrode, the source and drain electrodes being electrically connected, through the second and first gate insulation layers, to the first semiconductor layer;
    forming a via structure to electrically connect the first and second wirings to each other, wherein the via structure is formed simultaneously with the source electrode and the drain electrode;
    forming an insulating interlayer covering the second wiring on the second gate insulation layer;
    partially removing the insulating interlayer, the second gate insulation layer and the first gate insulation layer to form first openings that expose the first semiconductor layer;
    partially removing the insulating interlayer and the second gate insulation layer to form a second opening that partially exposes the second wiring and the first wiring;
    forming a conductive layer on the insulating interlayer to fill the first and second openings; and
    patterning the conductive layer to form the source electrode, the drain electrode and the via structure.

6. The method of claim 5, wherein the first openings and the second opening are formed by the same etching process.

* * * * *